United States Patent [19]

Spratt et al.

[11] Patent Number: 5,041,394
[45] Date of Patent: Aug. 20, 1991

[54] METHOD FOR FORMING PROTECTIVE BARRIER ON SILICIDED REGIONS

[75] Inventors: David B. Spratt; Robert H. Eklund, both of Plano, Tex.

[73] Assignee: Texas Instruments Incorporated, Dallas, Tex.

[21] Appl. No.: 634,970

[22] Filed: Jan. 7, 1991

Related U.S. Application Data

[63] Continuation of Ser. No. 405,703, Sep. 11, 1989, abandoned.

[51] Int. Cl.[5] .................. H01L 21/24; H01L 21/28
[52] U.S. Cl. ................ 437/200; 437/189; 437/192; 437/196; 437/201; 437/203; 437/246; 148/DIG. 19; 148/DIG. 147
[58] Field of Search ........... 437/200, 201, 202, 189, 437/192, 196, 246, 203, 190, 49; 148/DIG. 147, DIG. 19

[56] References Cited

U.S. PATENT DOCUMENTS

| | | | |
|---|---|---|---|
| 4,141,022 | 2/1979 | Sigg et al. | 437/192 |
| 4,381,215 | 4/1983 | Reynolds et al. | 437/196 |
| 4,528,744 | 7/1985 | Shibata | 437/201 |
| 4,892,843 | 1/1990 | Schmitz et al. | 437/189 |

FOREIGN PATENT DOCUMENTS 0227119 12/1984 Japan .................. 437/200

Primary Examiner—Brian E. Hearn
Assistant Examiner—Tuan Nguyen
Attorney, Agent, or Firm—James C. Kesterson; James T. Comfort; Melvin Sharp

[57] ABSTRACT

The described embodiments of the present invention provide a protective layer on the surface of silicided regions and methods for its formation. In the primary described embodiment, a titanium silicide layer is formed in integrated circuitry using self-aligned techniques. Local interconnection layers may be formed using biproducts of the self-aligned titanium disilicide formation. A layer of another siliciding metal, for example platinum, is then formed overall. The platinum layer is then subjected to an annealing step which causes a portion of the silicon in the titanium disilicide layers to react with the platinum to form platinum silicide. This platinum silicide layer is formed in a self-aligned manner on the surface of the silicided regions. The platinum silicide layer serves to protect the underlying titanium disilicide layer from subsequent etching steps of other harmful processing operations.

18 Claims, 5 Drawing Sheets

METHOD FOR FORMING PROTECTIVE BARRIER ON SILICIDED REGIONS

This application is a continuation of application Ser. No. 07/405,703 filed Sept. 11, 1989, now abandoned.

FIELD OF THE INVENTION

The present invention relates to the field of integrated circuit manufacturing techniques. More specifically, the present invention relates to techniques of forming silicided regions in integrated circuitry.

BACKGROUND OF THE INVENTION

In order to provide smaller components in integrated circuit devices, it has been found necessary to provide shallower doped regions (i.e., sources, drains, etc.) in order to raise the breakdown voltage level between nearby junctions. In addition, shallower junctions provide less diffusion of dopant into the integrated circuit substrate and thus minimize the chances of shorts between doped regions.

However, the conductivity of doped regions is proportional to the area of the doped region perpendicular to current flow. With shallower junctions, the resistivity of the doped regions is increased. This causes slower circuit operation and higher power consumption.

To combat the lowered resistance of shallow diffusions, the formation of highly conductive regions on the surface of diffusions has been employed. For example, in Tasch, et al., U.S. Pat. No. 4,384,301, issued May 17, 1983, and assigned to the assignee of this application, Titanium disilicide regions are formed in a self-aligned manner onto silicon regions. Thus a highly conductive region on the surface of diffusions is formed. However, in order to form interconnections to the diffusions, an insulating layer formed over these diffusions must be etched to provide a via from the top surface of this insulating layer to the diffusion itself. The titanium silicide layers and the diffusion are both relatively thin. During the etching of the via in the interlevel insulating layer, the etching attacks the surface of the titanium silicide in the diffusion. In some instances, this can etch through the diffused region and thus a failure in the integrated circuit. This example and other situations show the need for forming a protective layer on the surface of silicided regions in integrated circuitry.

SUMMARY OF THE INVENTION

The described embodiments of the present invention provide a protective layer on the surface of silicided regions and methods for forming the protective layer. In the primary described embodiment, a titanium silicide layer is formed in integrated circuitry using self-aligned techniques. Local interconnection layers may be formed using biproducts of the self-aligned titanium disilicide formation. A layer of another siliciding metal, for example platinum, is then formed overall. The platinum layer is then subjected to an annealing step which causes a portion of the silicon in the titanium disilicide layers to react with the platinum to form platinum silicide. This platinum silicide layer is formed in a self-aligned manner on the surface of the silicided regions. The platinum silicide layer serves to protect the underlying titanium disilicide layer from subsequent etching steps or other harmful processing operations.

DETAILED DESCRIPTION

FIGS. 1 through 10 are sideview schematic diagrams showing a preferred embodiment of the present invention. In FIGS. 1 through 10, a protective layer is formed on the surface of a source/drain of a field effect transistor. As will become apparent to those skilled in the art in light of this specification, the use of the invention is not limited to that of source/drains in field effect transistors or to field effect transistors at all. The invention has wide applicability in all areas of integrated circuit fabrication.

Figure 1:
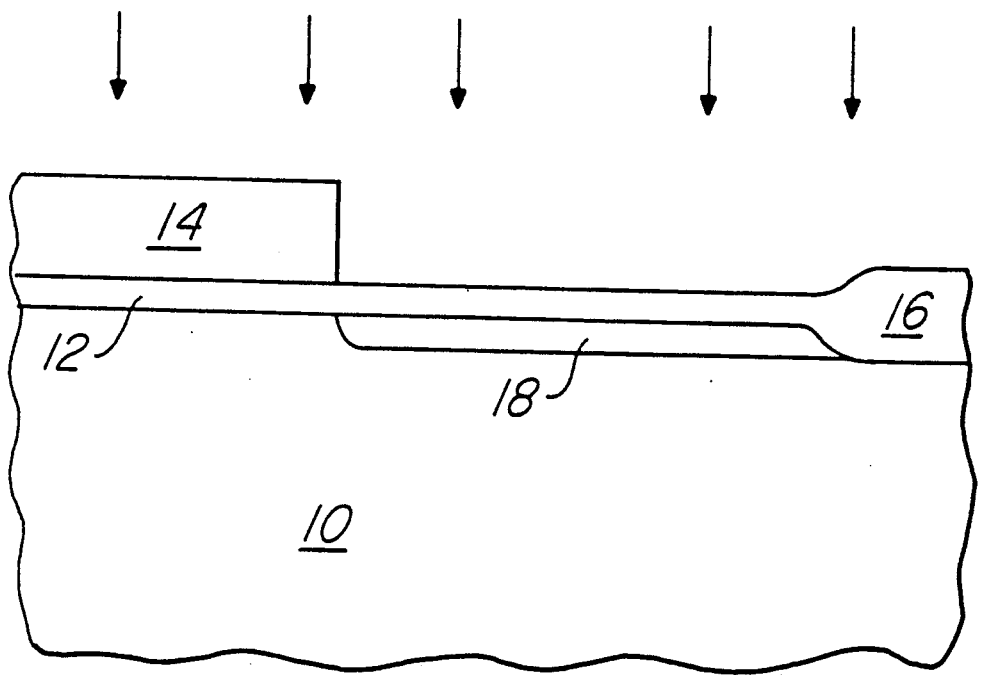
FIGS. 1 through 10 are sideview schematic diagrams showing the processing steps of a preferred embodiment of the present invention wherein a platinum silicide protective layer is formed on the surface of a titanium disilicide region.

FIG. 1 shows the initial steps of the preferred embodiment. Substrate 10 is a crystalline silicon substrate. Substrate 10 is a P type substrate in the described embodiment, however the doping type of the substrate does not play a significant part in the present process. For example, substrate 10 could be N type. Thick field silicon dioxide region 16 is formed by local oxidation of silicon using a process such as that shown in Havemann, et al., U.S. Pat. No. 4,541,167, issued Sept. 17, 1985 and assigned to the assignee of this application. Substrate 10 is then subjected to thermal oxidation in a steam environment for approximately 7 minutes at a temperature of approximately 850° C. to form silicon dioxide layer 12 as shown in FIG. 1. Polycrystalline silicon layer 14 is then deposited using chemical vapor deposition to a thickness of approximately 4,500 Angstroms. Polycrystalline silicon layer 14 is then patterned using common photolithographic techniques. The structure of FIG. 1 is then subjected to an ion implantation of phosphorous ions having a density of approximately $2 \times 10^{13}$ ions per centimeter$^2$ and an energy of approximately 80 kiloelectron volts. This ion implantation is annealed to form lightly doped region 18 as shown in FIG. 1. Lightly doped region 18 is selected as an N type region to be opposite with the doping level of substrate 10. The doping type or level of this doped region does not impact practice of the invention itself but is specific to the described embodiment of the invention.

Figure 2:
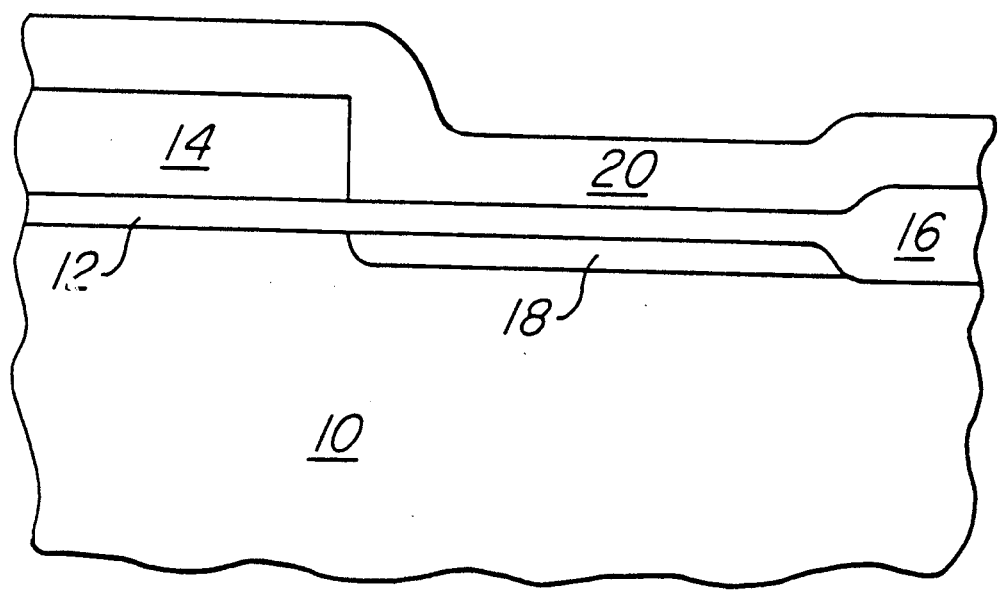
Figure 3:
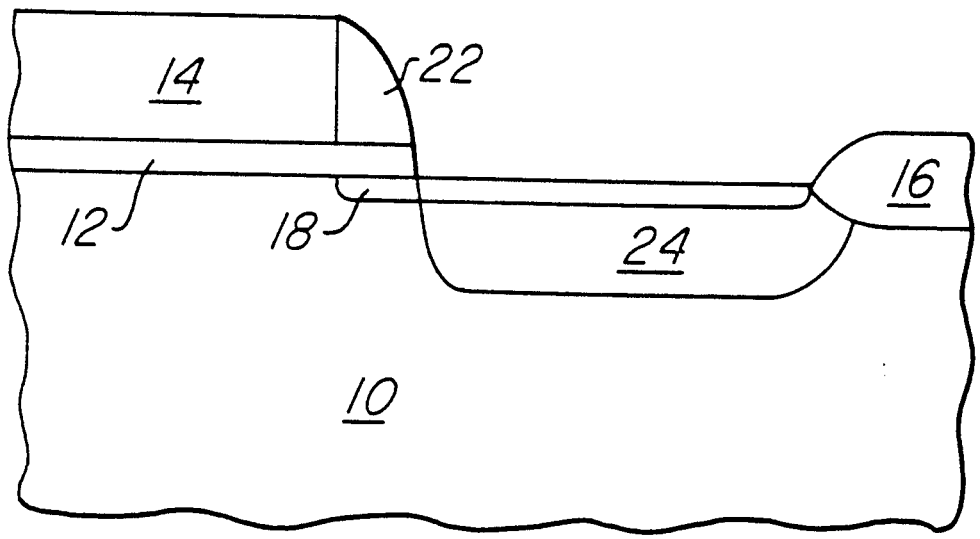

A layer of silicon dioxide 20 is the formed on the surface of the structure of FIG. 1 as shown in FIG. 2. Silicon dioxide layer 20 is conformally deposited using low pressure chemical vapor deposition. Silicon dioxide layer 20 is then etched using a mixture of oxygen, $C_2F_6$, CHF$_3$ and helium. The etching is conducted until the portion of silicon dioxide layer 12 overlying doped region 18 is cleared as shown in FIG. 3. In addition, silicon dioxide sidewall layer 22 is formed because of the nature of anisotropic etching. The resulting structure is shown in FIG. 3. The structure of FIG. 3 is subjected to a double ion implantation of arsenic and phosphorous ions. The arsenic ions are implanted at a density of approximately $3 \times 10^{15}$ ions per centimeter$^2$ and an energy of approximately 150 kiloelectron volts. The phosphorous ions are implanted at a density o approximately $4 \times 10^{14}$ ions per centimeter$^2$ and an en ergy of approximately 85 kiloelectron volts. This io implantation forms doped region 24 as shown in FIG.

Figure 4:
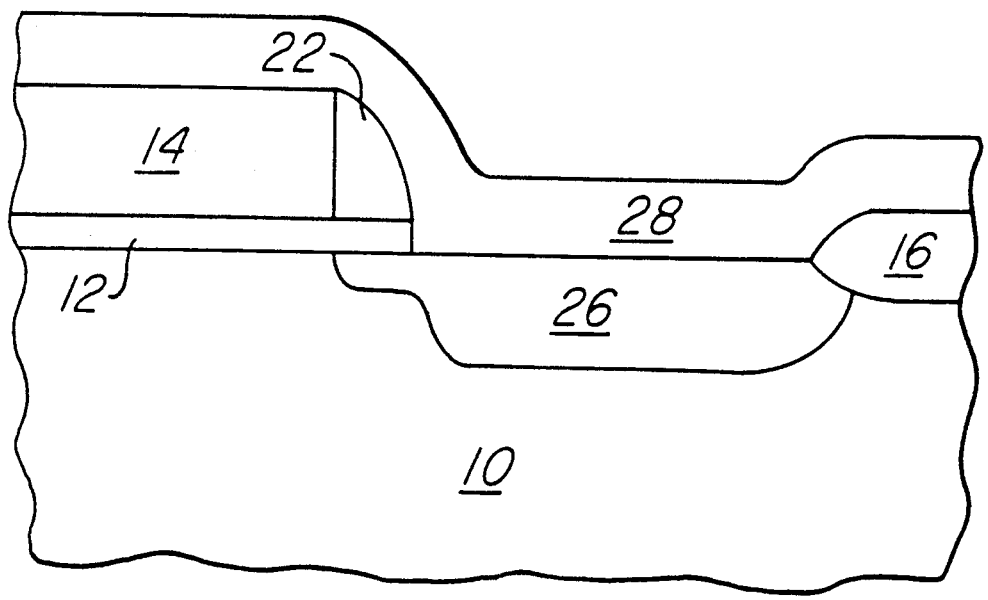
Figure 5:
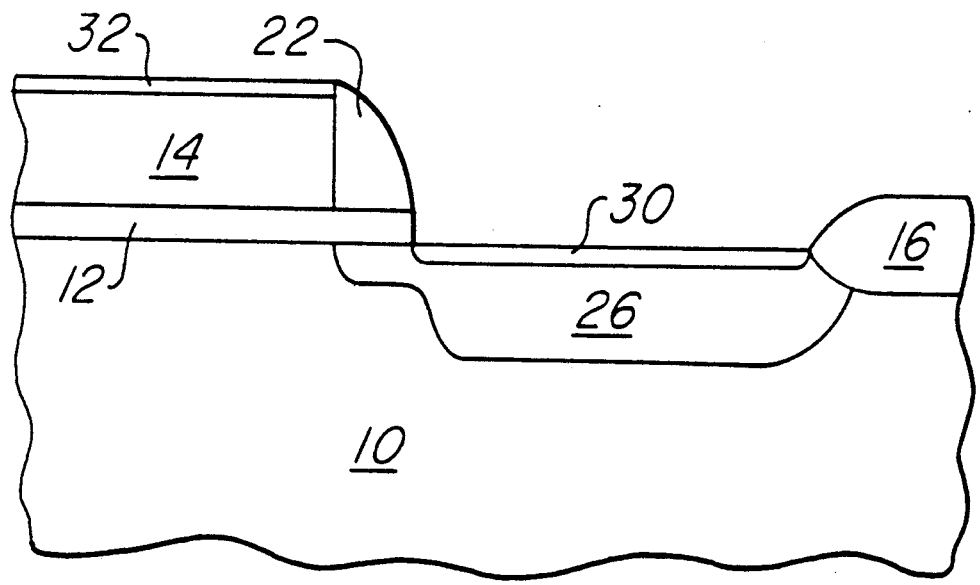
Figure 6:
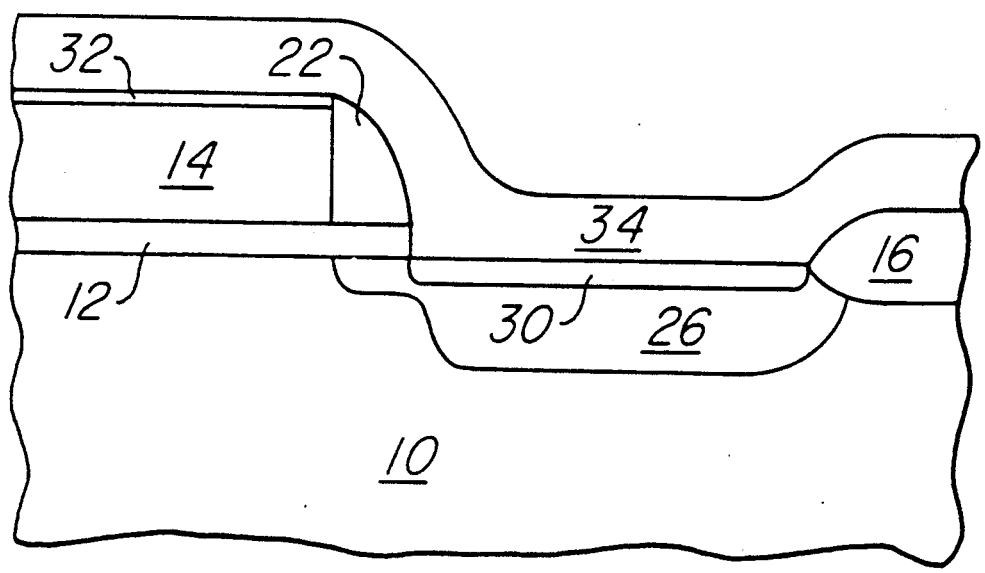

A layer of titanium is then deposited by sputter depc sition in a surface of the structure of FIG. 3 as shown i FIG. 4. Lightly doped region 18 and doped region 24 are combined to provide source/drain region 26 for convenience of description. The structure of FIG. 4 is then subjected to an annealing process at a temperature of approximately 625° C. to 675° C. in a nitrogen environment. A portion of titanium layer 28 reacts with silicon substrate 10 and polycrystalline silicon gate 14 to form titanium disilicide regions 30 and 32 as shown in FIG. 5. The unreacted portion of titanium layer 28 reacts with the nitrogen environment to form titanium nitride. This process is described in more detail in Lau, U.S. Pat. No. 4,545,116, issued Oct. 8, 1985 and assigned to the assignee of this application. The titanium nitride is removed by wet etching leaving titanium disilicide layers 30 and 32 as shown in FIG. 5. A layer of platinum 34 is then deposited on the surface of the structure of FIG. 5 as shown in FIG. 6. The structure of FIG. 6 is then subjected to an annealing step, preferably in a low temperature of approximately 450° C. to 525° C. but temperatures of up to 600° C. may be advantageously used. The lower temperature anneal is selected to minimize diffusion of dopants in source/drain 26, for example. Other temperatures and a wide range of anneal times may be used, but the lower temperature is preferred. The unreacted portion of platinum layer 34 is then removed by wet etching in aqua regia leaving the structure of FIG. 7 having platinum silicide regions 36 and 38. Platinum silicide regions 36 and 38 are approximately 150 Angstroms thick and are formed along the exposed portions of titanium disilicide regions 30 and 32. Platinum silicide is more robust than titanium disilicide. Thus, platinum silicide regions 36 and 38 provide a protective layer over titanium disilicide regions 30 and 32.

Figure 7:
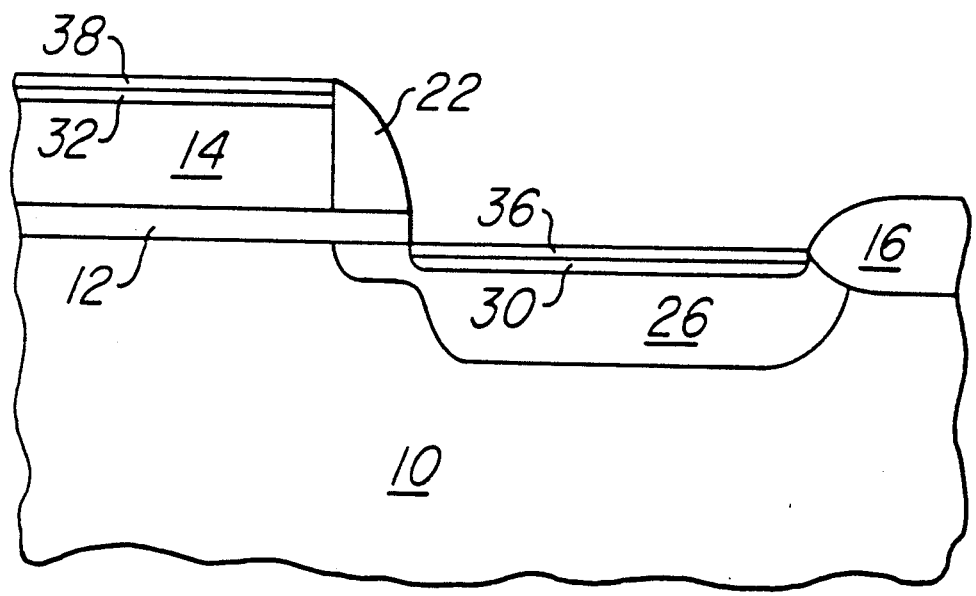
Figure 8:
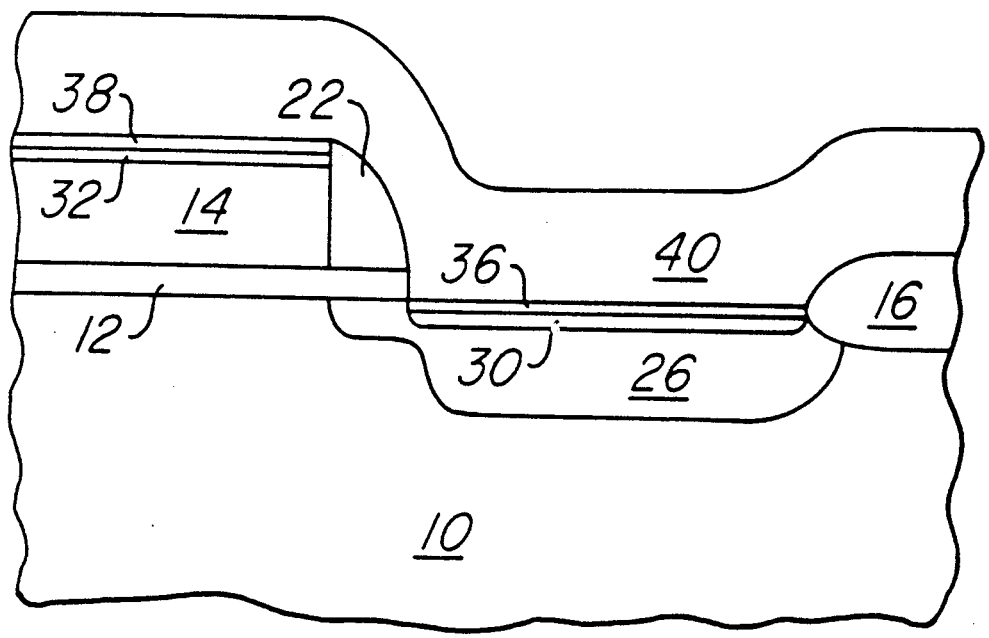
Figure 9:
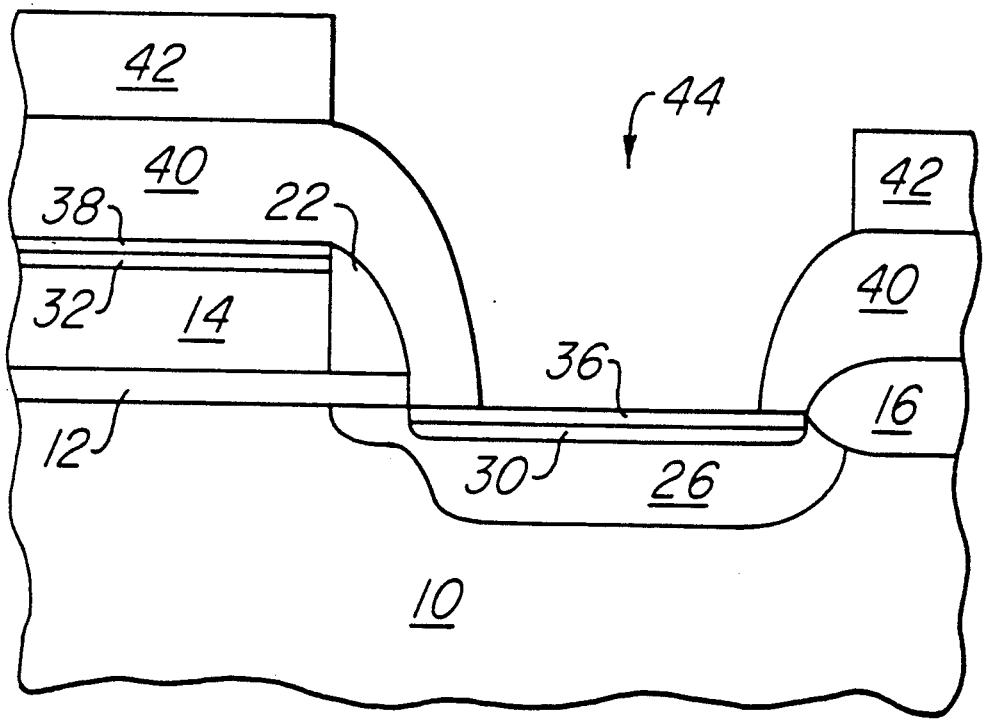
Figure 10:
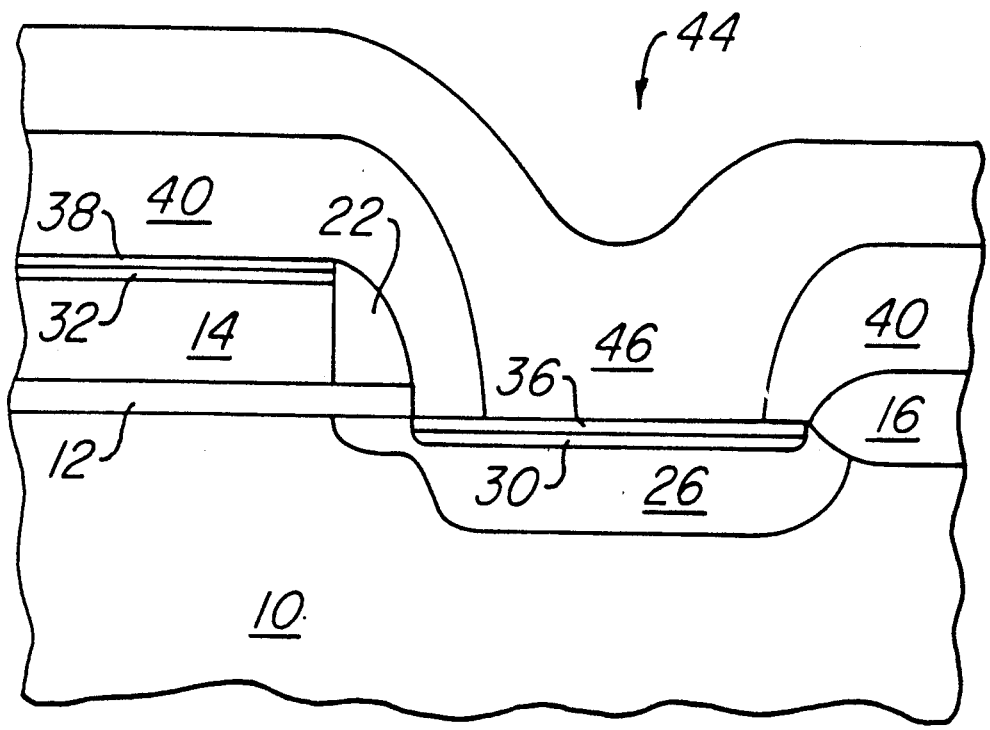

An inter-level oxide layer 40 is then deposited on the surface of the structure of FIG. 7 to a thickness of approximately 10,000 Angstroms using low pressure chemical vapor deposition. A layer of photoresist is formed and patterned on the structure of FIG. 8 as shown in FIG. 9. Photoresist 42 provides an etch mask for the formation of via 44 which provides an opening to the surface of platinum silicide layer 36. Silicon dioxide layer 40 is etched using a mixture of oxygen, $C_2F_6$, $CHF_3$ and helium. Because this etching process is highly selective to platinum silicide, and is less selective to titanium disilicide, platinum silicide layer 36 provides a protective layer to protect the integrity of not only titanium disilicide layer layer 30 but source/drain region 26. In the absence of platinum silicide layer 36, formation of via 44 might etch completely through titanium disilicide layer 30 and source/drain region 26 to substrate 10. Photoresist layer 42 is then removed using common ashing and wet removal techniques and a conductive layer 46, for example a tungsten layer, is deposited on the surface of inter-level oxide layer 40 and into via 44 to provide contact at a surface of platinum silicide surface 36. If during the formation of via 44, titanium disilicide layer 30 and source/drain region 26 were etched through to substrate 10, conductive layer 46 would make direct contact to substrate 10 and the circuit containing the portion of FIG. 10 would be inoperable.

Although specific embodiments of the present invention are herein described, they are not to be construed as limiting the scope of the present invention. For example, although the preferred embodiment shows the use of protective platinum silicide layer 36 on the surface of titanium disilicide layer 30, platinum layer 36 can provide protective functions in other circumstances than the formation of vias to doped regions. For example, platinum silicide layer 38 may provide protection for titanium disilicide layer 32 during planarization of inter-level oxide layer 40 on the surface of the integrated circuit. Many embodiments of the present invention will become clear to those skilled in the art in light of the teachings of the specification. The scope of the invention is limited only by the claims appended hereto.

What is claimed is:

1. A method for forming a protective layer in an integrated circuit, comprising the steps of:
    providing a silicon substrate;
    forming and patterning a protective layer on said substrate;
    forming a doped region on said substrate;
    depositing a layer of a first metal overall;
    reacting said first metal with said doped region where said doped region is not covered by said protective layer to form a first metal silicide;
    selectively removing the unreacted portion of said first metal;
    depositing a layer of a second metal overall which is a different material than said first metal;
    reacting said second metal with said first metal silicide to form a protective metal silicide layer over said first silicide layer and having a first etching selectivity;
    selectively removing the unreacted portion of said layer of second metal;
    forming a layer of a selected material over portions of said integrated circuit, including said protective metal silicide layer said selected material having a different etching selectivity than said protective silicide; and
    selectively etching to remove said selected material to expose without removing at least a portion of said protective metal silicide layer.

2. A method as in claim 1 wherein said silicon substrate is a single crystal silicon substrate.

3. A method as in claim 1 wherein said protective layer comprises silicon dioxide.

4. A method as in claim 1 wherein said first metal is titanium.

5. A method as in claim 1 wherein said second metal is platinum.

6. A method as in claim 1 wherein said first metal is titanium and said second metal is platinum.

7. A method as in claim 1 wherein said reacting of said second metal is performed by heating to a temperature of less than 600° Celsius.

8. A method as in claim 1 wherein said selected material is an insulating layer and further including the step of depositing a conductive layer in a selected pattern over said insulating layer and in contact with said protective metal silicide layer.

9. A method for forming a protective layer in an integrated circuit, comprising the steps of:
    providing a silicon substrate;
    forming and patterning a protective layer on said substrate;
    forming a doped region on said substrate;
    depositing a layer of a first metal overall;
    reacting said first metal with said doped region where said doped region is not covered by said protective layer to form a first metal silicide, the portion of said first metal which does not react with said substrate providing a conductive layer;

patterning said conductive layer to provide selected electrical interconnections;

depositing a layer of a second metal overall which is a different material than said first metal;

reacting said second metal with said first metal silicide to form a protective metal silicide layer over said first silicide layer and having a first etching selectivity;

selectively removing the unreacted portion of said layer of second metal;

forming a layer of a selected material over portions of said integrated circuit, including said protective metal silicide layer, said selective material having a different etching selectivity than said protective silicide; and selectively etching to remove said selected material to expose without removing at least a portion of said protective metal silicide layer.

10. A method as in claim 9 wherein said silicon substrate is a single crystal silicon substrate.

11. A method as in claim 9 wherein said protective layer comprises silicon dioxide.

12. A method as in claim 9 wherein said first metal is titanium.

13. A method as in claim 9 wherein said second metal is platinum.

14. A method as in claim 9 wherein said first metal is titanium and said second metal is platinum.

15. A method as in claim 9 wherein said reacting of said second metal is performed by heating to a temperature of less than 600° Celsius.

16. A method as in claim 9 wherein said conductive layer comprises a product of the reaction of said first metal with an ambient gas, said ambient gas being present during said reacting said first metal.

17. A method as in claim 16 wherein said ambient gas in nitrogen.

18. A method as in claim 16 wherein said ambient gas is nitrogen and said first metal is titanium.

* * * * *